(12) United States Patent
Childs (10) Patent No.: US 10,398,015 B2
(45) Date of Patent: Aug. 27, 2019

(54) ION GENERATOR APPARATUS

(71) Applicant: Montgomery William Childs, Oro Medonte (CA)

(72) Inventor: Montgomery William Childs, Oro Medonte (CA)

(*) Notice: Subject to any disclaimer, the term of this patent is extended or adjusted under 35 U.S.C. 154(b) by 0 days.

(21) Appl. No.: 16/105,365

(22) Filed: Aug. 20, 2018

(65) Prior Publication Data

US 2019/0059148 A1   Feb. 21, 2019

Related U.S. Application Data

(60) Provisional application No. 62/547,455, filed on Aug. 18, 2017.

(51) Int. Cl.
| | | |
|---|---|---|
| *H01J 21/08* | (2006.01) | |
| *H01J 21/22* | (2006.01) | |
| *H05H 1/46* | (2006.01) | |
| *B01J 19/08* | (2006.01) | |
| *H01J 37/32* | (2006.01) | |
| *G21B 1/00* | (2006.01) | |

(52) U.S. Cl.
CPC .............. *H05H 1/46* (2013.01); *B01J 19/088* (2013.01); *G21B 1/00* (2013.01); *H01J 37/321* (2013.01); *H01J 37/32027* (2013.01); *H01J 37/3266* (2013.01); *H01J 37/32568* (2013.01); *H01J 37/32623* (2013.01); *H05H 2001/4697* (2013.01)

(58) Field of Classification Search
CPC . H05H 1/46; H05H 2001/4697; B01J 19/088; H01J 37/32027; H01J 37/321; H01J 37/32568; H01J 37/32623; H01J 37/3266; H01J 27/08; H01J 27/14

USPC ................ 315/111.01–111.91; 313/146–147
See application file for complete search history.

(56) References Cited

U.S. PATENT DOCUMENTS

| | | | | |
|---|---|---|---|---|
| 3,684,911 | A | | 8/1972 | Perugini |
| 4,785,220 | A | * | 11/1988 | Brown ..................... H01J 27/08 313/147 |
| 4,933,060 | A | * | 6/1990 | Prohaska ................. B29C 59/14 204/192.36 |
| 5,359,966 | A | | 11/1994 | Jensen |
| 5,623,148 | A | * | 4/1997 | Wenzel .................. H01J 37/067 219/121.27 |
| 5,685,997 | A | | 11/1997 | LoPresti |
| 6,380,268 | B1 | | 4/2002 | Yakobson et al. |
| 7,557,511 | B2 | * | 7/2009 | Strikovski ........ H01J 37/32009 156/345.35 |

(Continued)

OTHER PUBLICATIONS

W Lowell Morgan and Montgomery W Childs; Study of Striations in a Spherically symmetric hydrogen discharge; Plasma Sources Science Technology; 24 Sep. 23, 2015, pp. 1-9.

(Continued)

*Primary Examiner* — Tung X Le
*Assistant Examiner* — Henry Luong
(74) *Attorney, Agent, or Firm* — Eugene F. Derényi; Fogler, Rubinoff LLP (57) ABSTRACT

An ion generator including a vacuum chamber; an anode in the chamber, and two movable cathodes in the chamber whereby the distance of the cathodes relative to the anode can be varied. A servo actuated motor can be operably connected to each movable cathode to move the cathodes in the chamber and modify the plasma generated.

15 Claims, 10 Drawing Sheets

(56) References Cited

U.S. PATENT DOCUMENTS

| | | | | |
|---|---|---|---|---|
| 2002/0179428 A1* | 12/2002 | Anazawa | ................. | B01J 3/006 |
| | | | | 204/173 |
| 2010/0125267 A1 | 5/2010 | Lee | | |
| 2011/0239542 A1 | 10/2011 | Liu | | |
| 2011/0309050 A1* | 12/2011 | Iori | ................... | H01J 37/32357 |
| | | | | 216/67 |
| 2013/0309416 A1 | 11/2013 | Yokoyama | | |
| 2018/0193816 A1* | 7/2018 | Letts | ....................... | B01J 19/18 |

OTHER PUBLICATIONS

Office Action dated Feb. 1, 2019, U.S. Appl. No. 16/105,190.
Cercek et al.; PIC Simulation of a Double Layer Formation in a Hydrogen Plasma with Negative Ions; 29th EPS Conference on Plasma Phys. and Contr. Fusion Montreux, Jun. 17-21, 2002 ECA vol. 26B, P2-006, pp. 1-4.

* cited by examiner

ION GENERATOR APPARATUS

CROSS-REFERENCE TO RELATED APPLICATION

This application claims the benefit of U.S. Provisional Patent Application Ser. No. 62/547,455 filed Aug. 18, 2017.

FIELD OF DISCLOSURE

This disclosure relates to the field of plasma generating devices for high temperature plasma and fusion research.

BACKGROUND OF THE DISCLOSURE

Some ion generators for generating plasma use fixed anode and cathode distances, thereby preventing the ability to tune the plasma to specific electric potentials and desired settings. Other ion generators utilize the body of the apparatus as the cathode. For plasma generation, precise positioning of the cathode(s) relative to the anode is desired.

SUMMARY OF THE DISCLOSURE

In one aspect, the present disclosure relates to a central anode bracketed by two cathodes in a vacuum chamber. The cathodes can have a variety of different configurations, such as a ring or surrounding sphere or rod or smaller sphere. The distance between the cathodes and the anode is controlled by high precision servo drive motors. The high surface area ratio between the cathodes and anode enable copious electron flow and subsequent ion generation from the anode. While this configuration is shown in the form of a large steel chamber, it can be expanded to any vacuum chamber size to accommodate a larger or smaller requirement for ions and plasma generation. The cathodes are designed to minimize edge discharge effects by a curving the outer edges of the plate In another aspect, the present disclosure addresses issues with prompt ignition of plasma which are overcome by the design of adjustable cathodes that can be moved closer to or farther from the anode. This enables ease of plasma ignition and subsequent movement away from the anode to further adjust the electron and ion concentration and voltage potential. The utilization of movable cathodes enables greater flexibility and control of plasma regimes.

In another aspect, the present disclosure relates to an apparatus including a chamber and an anode and a cathode for producing plasmas of various regimes at reduced pressures in a variety of gases. The chamber can be pressurized and can be a vacuum chamber. In another aspect, the cathode is movable in the chamber. Two cathodes can be used. The position of the cathodes in the chamber and in turn their position relative to the anode can be varied. The anode can have a spherical geometry. With such a configuration, a reasonably low voltage and amperage can be used to obtain stable spherical plasma in a glow discharge around a spherical anode. The present inventor has observed that high energy discharge events can arise from self-assembly and subsequent discharge of electric plasma double layers. Without being bound by theory, a high surface area ratio between the cathode and anode enables high current density to impinge upon the anode which results in rapid thermal heating of both the plasma and anode, which results in rapid ion loss from the anode. The point at which the discharge can occur is governed by the pressure of the gas, the type of gas, the distance of the electrodes, and the voltage potential. Once the plasma ignites, charge can flow between the electrodes, and its characteristics are governed by the current and voltage potential.

In another aspect, the present disclosure relates to a spherical anode with distance adjustable dual cathodes for generating positive ions through a non-equilibrium collisional plasma powered by a direct current power supply. The ions generated can form dense, stable, multiple plasma double layers. Without being bound by theory, these double layers are regions of separated charge that serve to further augment the ion density, radio frequency emission, and other phenomenon across the electromagnetic spectrum. The present apparatus, because of the ability to move the cathodes with precision, can be operated under a wide range of plasma conditions, including glow discharge, anode tufting, high power quiescent, multiple double layers, and a high power discharging mode which produces copious amounts of energy within the discharges. In addition, electromagnetic field generators are used to further control the many plasma regimes.

In another aspect, the present disclosure relates to an apparatus that can ignite a spherical high voltage, high current discharge in a variety of gas atmospheres and pressures, enabled by adjustable distance cathodes in relation to the anode, and can further direct the plasma by use of electromagnetic field generators. The anode can have various configurations including a solid metal, semi-metal, or coated anode; or can be a hollow anode that diffuses high pressure gas at a controlled rate into the surrounding atmosphere in a chamber. The hollow anode configuration leads to electron collisions occurring at greater distances from the anode surface than when the anode is solid, since the diffusion of the gas from the surface pushes the gas breakdown in the plasma to greater distances from the solid surface. Because of the spherical geometry, extremely high electric fields are obtained and stable double layers form reproducibly and reliably. The electromagnetic field generators are of a design by which a vector electromagnetic field can be generated as either positive or negative and by which the direction of the field can easily be changed to oppose or attract ions and electrons thus providing further control over the various plasma regimes. The conical geometrical shape of the electromagnetic generators is of a design by which a focused electromagnetic field is developed having the effect of a unipolar magnetic field. In certain aspects, the geometry of the electromagnetic field generator can be spherical, in other aspects, conical, or employ other geometries.

In another aspect, the present disclosure relates to an ion generator including a vacuum chamber, an anode in the chamber, and two movable cathodes in the chamber, whereby the distance of the cathodes relative to the anode can be varied. The ion generator can further include a servo actuated motor operably connected to each movable cathode to move the cathodes. In one aspect, the vacuum chamber is capable of containing a gas under pressure, the gas selected from the group consisting of helium, hydrogen, deuterium, tritium, argon, water, nitrogen, oxygen, neon, and mixtures thereof. In another aspect, the chamber is capable of containing a gas at a pressure up to and including 10-9 torr. In another aspect, the ion generator further includes a direct current regulated power supply including for the supply of radio and micro wave frequencies whereby plasma regimes in the generator may be enhanced. In another aspect, the anode is a hollow anode formed by a metallic matrix and adapted to be positively charged and pressurized by the gas whereby electrons of the gas can be stripped off and diffused through the metallic matrix, whereby a purer reactive ionized gas can be supplied to interact enhancing the potential of high energy plasma double layers. In another aspect, the cathodes are moveable in the chamber such that the distance of the cathodes from the anode is can be varied, whereby ease of plasma ignition and tunability during a plasma discharge can be facilitated. The cathodes are made of a material conducive to good electron emission, and in certain embodiments, the material is selected from the group consisting of copper, stainless steel, aluminum, and tungsten. In one embodiment, the electromagnetic field generators include a coil geometry whereby the induced field can be even or uniform or adjusted to be stronger at one end of the chamber than the other end. In certain embodiments, the geometry of the electromagnetic field generators is selected from the group consisting of a spherical shape, a conical shape and geometric variants thereof, whereby the electromagnetic field providing the capability to either push ions away from the anode or coalesce toward the anode having the effect of enhancing the natural formation of plasma double layers. In another embodiment, the chamber further including an anti-chamber which is adapted to enable the anode to be retracted without the need to pressurize the vacuum chamber from an experimental vacuum setting, separated by a butterfly valve capable of maintaining a desired pressure differential. In another embodiment, the anti-chamber can include a lower section composed of a screw-driven base that feeds a driver with the anode mount, and an upper section that can be opened to enable change-out of the anode assembly that is under a constant flow of inert gas to prevent atmospheric water adsorption.

BRIEF DESCRIPTION OF THE DRAWING

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
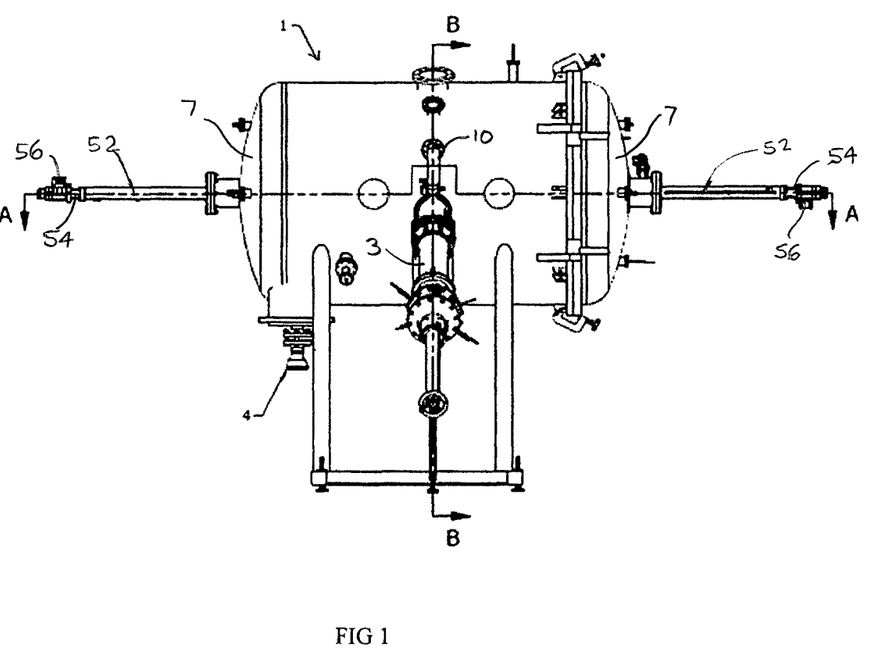
FIG. 1 is front elevation view of a vacuum chamber assembly for functional plasma generation according to an embodiment of the present invention.
Figure 1A:
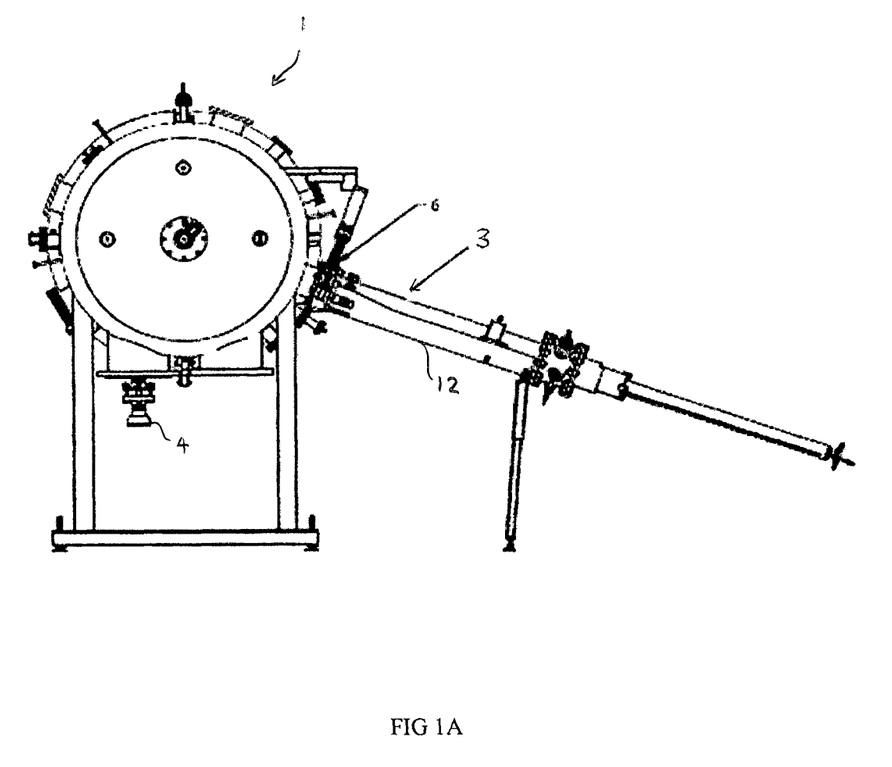
FIG. 1A is side elevation view thereof.
Figure 1B:
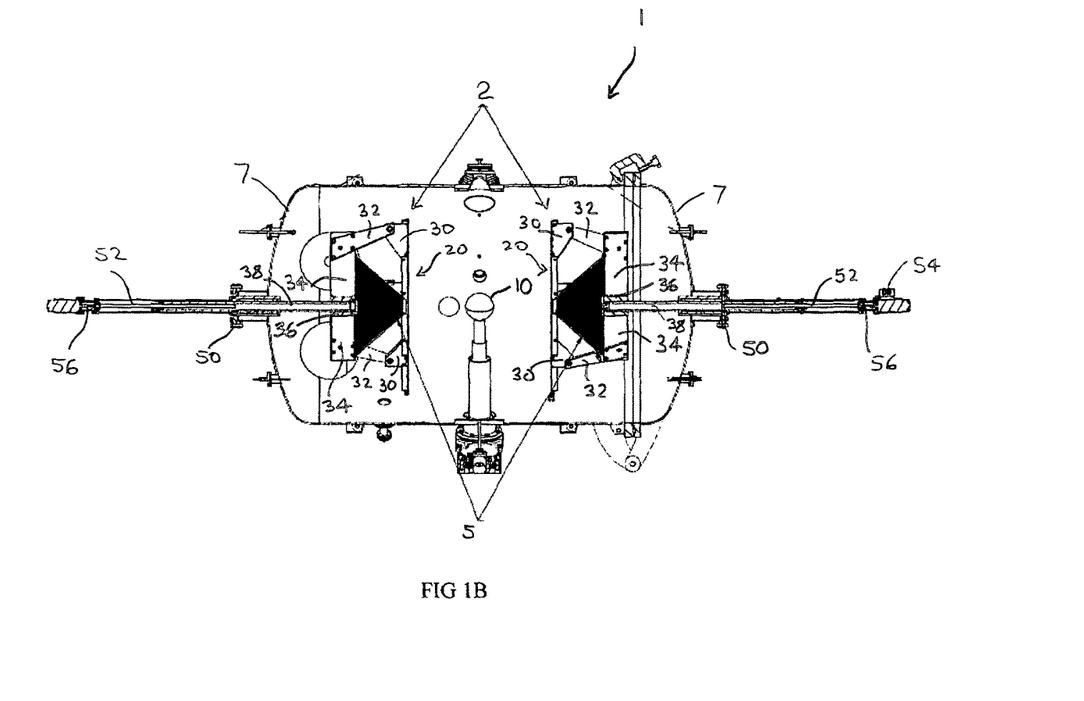
FIG. 1B is section view through FIG. 1.
Figure 1C:
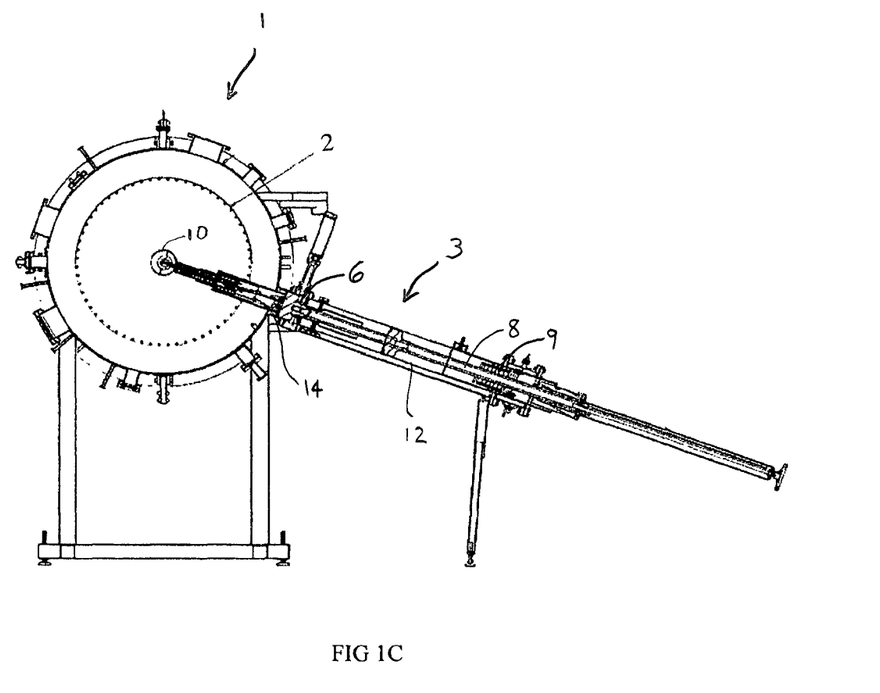
FIG. 1C is a section view along line B-B of FIG. 1.

Referring initially to FIG. 1, the present invention according to one aspect relates to a chamber assembly indicated generally at 1 for generating plasma. The chamber 1 is a construction capable of maintaining a vacuum greater than $10^{-5}$ torr, while hosting all required sub-assemblies for plasma, measurement and observation thereof. Chamber doors 7 are dual-sealed with o-rings to further maintain vacuum pressure in the chamber 1. Further capabilities of the vacuum chamber include safety systems 4 to mitigate the chance of explosion or similar under extreme conditions, such as, a power-failure.

Two moveable cathode assemblies indicated generally at 2 driven by servo motors can be moved independently or together, with a positional accuracy greater than, for example, 0.001 inches (0.0254 mm). The cathode assemblies 2 are computer numerically controlled (CNC), enabling programming of the positions of the cathode and electromagnetic assemblies such as stationary or moving to any required distance at any time and with variable velocities.

An anode isolation chamber indicated generally at 3 or anti-chamber, provides the functionality to change and maintenance an anode electrode 10 at any given time without compromising the environment within the chamber 1. The anode isolation chamber 3 includes a tube 12 fitted to a port 14 in the wall of the chamber 1 for receiving the anode 10. The anode 10 is attached to a ball screw 8 and ball nut 9. The anode 10 can be moved into or out of the chamber 1 by rotating the ball screw 8, either manually or by a motor such as a servo motor. The anode 10 can also be withdrawn from the chamber 1 into the isolation chamber 3, When the anode 10 is completely withdrawn into the isolation chamber 3, a gate-valve 6 can be closed to seal off the chamber 1 and enabling the isolation chamber 3 to be opened to access the anode 10, for replacement or maintenance for example.

Figure 2:
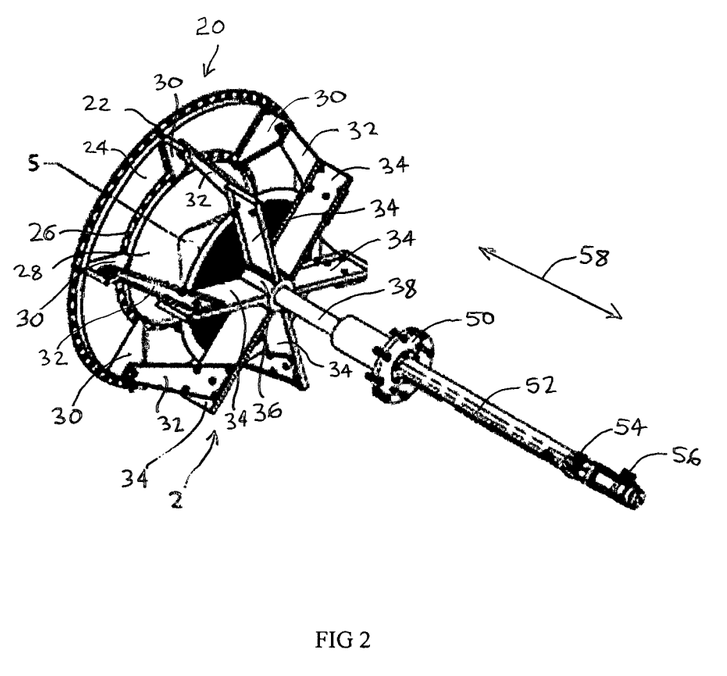
FIG. 2 is an isometric view of one of the cathode and electromagnetic (E.M.) cone assemblies of FIG. 1B.

The cathode assemblies 2 include a cathode disk indicated generally at 20. The cathode disk 20 includes an outer ring 22, outer disk 24, inner ring 26 and inner disk 28. In one embodiment, the cathode disk 20 is made of copper.

Fins 30 are provided on the outer ring 24. Each fin 30 is connected with a support rib 32 to a fin 34. The fins 34 radiate from a sleeve 36 on a rod 38. Rod 38 passed through a port 50 (shown in isolation without the chamber) in the chamber 1 and connects to a ball screw 52 and ball nut 54. The ball screw 52 is driven by a servo motor 56 to move the cathode assembly 2 toward or away from the anode 10 in either direction indicated by the arrows of line 58.

Figure 6:
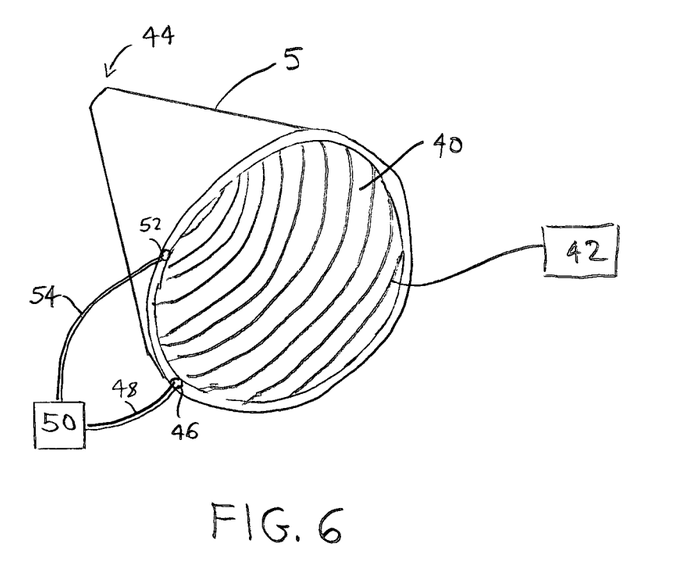

E.M. (electro-magnetic) cones 5 are installed on the fins 34 behind the cathode disks 20. Wire windings 40 are located on the inside of the cones 5 and conform to the inside of the cone 5. The wire windings 40 are connected to and can be energized by an electrical source 42 which can be an AC or DC power supply for example. The conical shape (or a frusto-conical shape as in the present embodiment), winding and charge-direction (positive vs. negative) of the E.M. cones 5 provide functionality to create a controllable (shape and force) magnetic field in two directions, thus providing the capability to either "push" and/or "pull" and/or contain plasma in the desired direction and containment and or dispersion. In one embodiment of the present invention, the windings 40, when energized, can create a mono-polar electromagnetic force, such that a fero-magnetic material can also be "suspended" at the narrow end indicated generally at 44 the cone 5.

In one embodiment, the cones 5 are hollow and include an inlet 46 connected via a cooling fluid inlet line 48 to a fluid source 50 and an outlet 52 connected to an outlet line 54 to the fluid source 50. A cooling fluid, such as water, can be circulated from the fluid source 50, through inlet line 48, through the hollow interior of the cone 5 and out the outlet 52 and back to the fluid source 50 in order to cool the cone 5 when in operation.

EXAMPLES

Example 1

Figure 3:
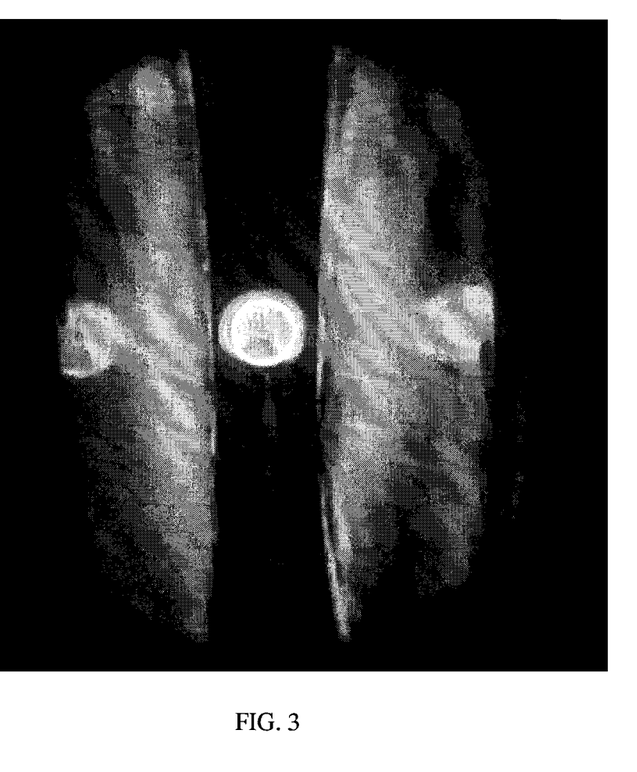
FIG. 3 is an image of a typical discharge on a spherical anode in hydrogen gas in a chamber according to an embodiment of the present invention.

FIG. 3 is an image of a typical discharge on a spherical anode in hydrogen gas in a chamber according to an embodiment of the present invention.

Example 2

Figure 4:
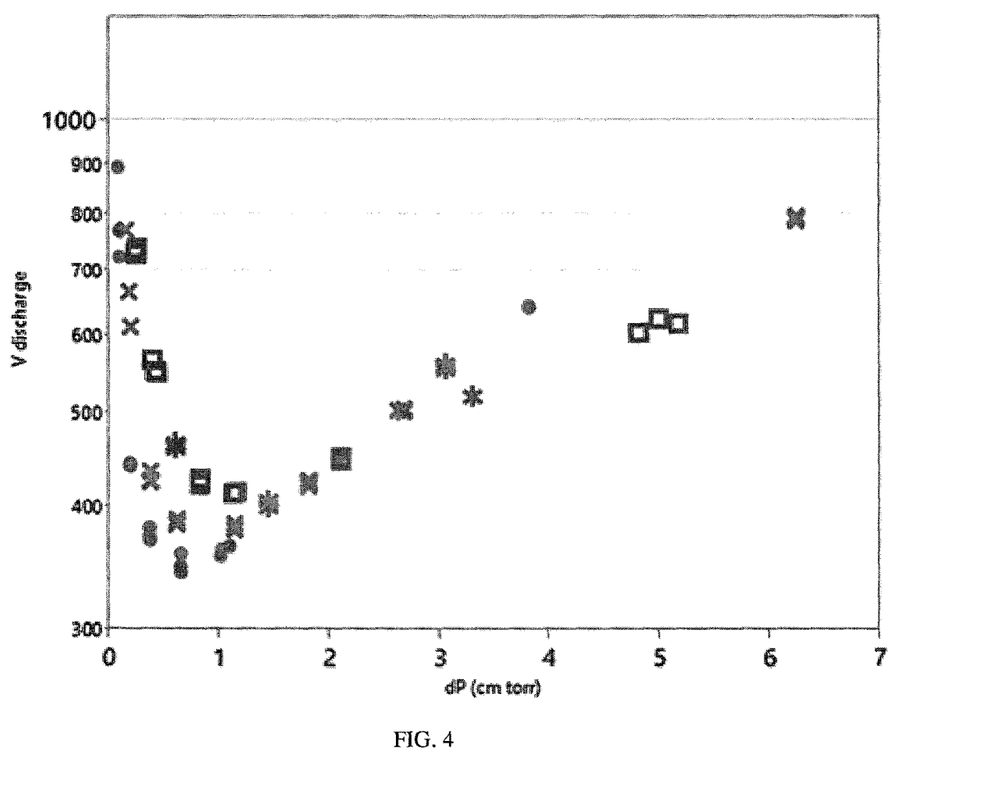
FIG. 4 is a graph depicting the Paschen curve for cathodes at various distances from an anode in a chamber according to an embodiment of the present invention.
Figure 5A:
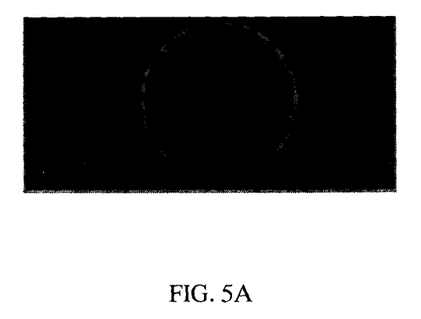
FIG. 5A-5E is a collection of plasma regimes created at 5 torr hydrogen and from FIG. 5A through to 5E, increasing the anode current from ~0.2 amps to 10 amps; and, FIG. 6 is an isometric view of the electromagnetic cone of FIG. 2.
Figure 5B:
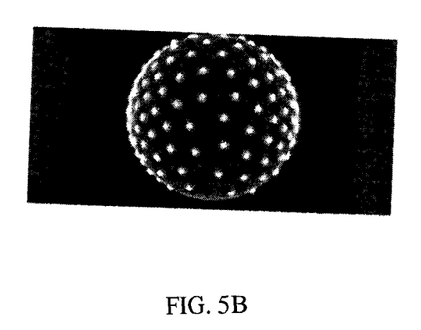
Figure 5C:
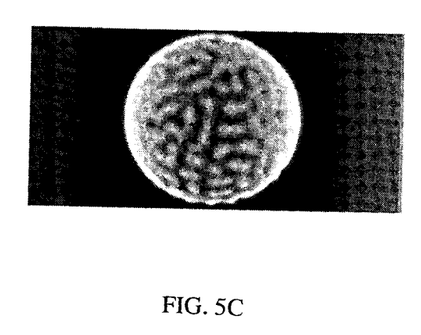
Figure 5D:
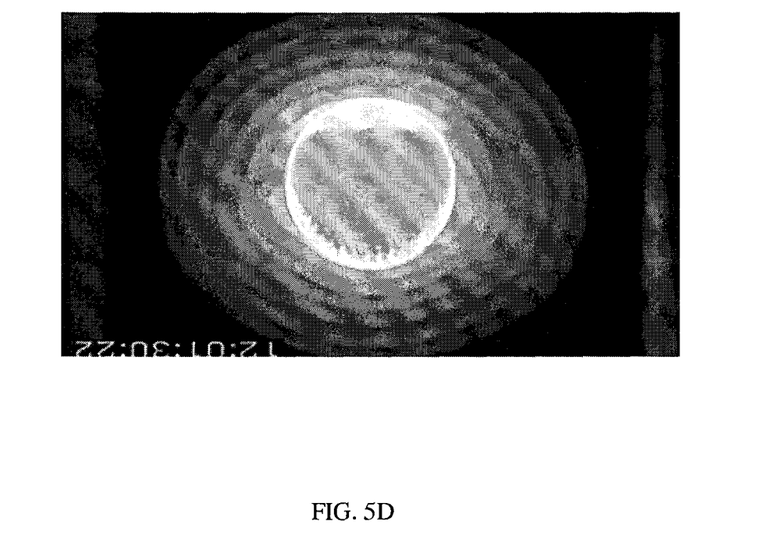
Figure 5E:
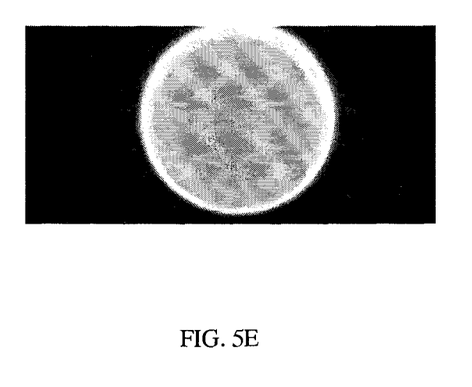

FIG. 4 is a graph depicting the Paschen curve for cathodes at various distances (●—3.81 cm, X—7.62 cm and □—15 cm) from an anode in a chamber according to an embodiment of the present invention. All of the distances were adjusted while the experiment was underway, which shows the utility and advantage of using the adjustable cathodes, as the cathodes are moved away from the anode during the discharge. In a planar electrode configuration, the distance-gas pressure factor (x-axis) generates a single u-shaped curve. However, with the present configuration of two cathodes and spherical anode, a departure from the single curve is encountered as a function of cathode distance.

Example 3

FIG. 5 shows the stable various regimes of plasma produced by a discharge in hydrogen gas at ~5 torr while increasing the current (from top to bottom, from ~0.2 amps to 8 amps). Of note are the numerous double layers which are reproducible.

Embodiments of the present invention are useful for obtaining a steady plasma in a variety of gas, pressure, and anode configurations. While the present embodiment was used as an example, it is inherent that other alternate designs, sizes, and configurations would fall within the scope of this invention. Accordingly, the present disclosure should only be limited by the scope of the claims that follow.

I claim:

1. An ion generator comprising:
   a vacuum chamber;
   an anode in the vacuum chamber, wherein the anode is a hollow anode formed by a metallic matrix and adapted to be positively charged and pressurized by a gas whereby electrons of the gas can be stripped off and diffused through the metallic matrix, whereby a purer reactive ionized gas can be supplied to interact enhancing the potential of high energy plasma double layers;
   two movable cathodes in the vacuum chamber; and
   a servo actuated motor operably connected to each movable cathode to move the two movable cathodes;
   whereby the position of the two movable cathodes relative to the anode can be varied.

2. The ion generator of claim 1, said each movable cathode further comprising a cathode disk and a cone shaped winding.

3. The ion generator of claim 2, further comprising a cone housing the cone shaped winding.

4. The ion generator of claim 1, wherein the vacuum chamber is capable of containing a gas under pressure, the gas selected from the group consisting of helium, hydrogen, deuterium, tritium, argon, water, nitrogen, oxygen, neon, and mixtures thereof.

5. The ion generator of claim 1, wherein the vacuum chamber is capable of containing a gas at a pressure up to and including 10-9 torr.

6. The ion generator of claim 1, further comprising a direct current regulated power supply for supplying radio and microwave frequencies, whereby plasma regimes in the ion generator may be enhanced.

7. The ion generator of claim 1, wherein the two movable cathodes comprising a material conducive to good electron emission.

8. The ion generator of claim 7, wherein the material selected from the group consisting of copper, stainless steel, aluminum, and tungsten.

9. The ion generator of claim 7, wherein the geometry of the electromagnetic field generators is selected from the group consisting of a spherical shape, a conical shape and geometric variants thereof, whereby the electromagnetic field providing the capability to either push ions away from the anode or coalesce toward the anode having the effect of enhancing natural formation of plasma double layers.

10. The ion generator of claim 1, wherein the servo actuated motors are capable of providing at least <0.01 mm of positional movement at a rate of 0.01 m to 1 m/second.

11. The ion generator of claim 1, further comprising electromagnetic field generators to further guide and tune high energy the plasma double layers.

12. The ion generator of claim 11, wherein the electromagnetic field generators comprise a coil geometry whereby an induced field can be even or uniform or adjusted to be stronger at one end of the vacuum chamber than at another end of the vacuum chamber.

13. The ion generator of claim 11, wherein the electromagnetic field generators are powered by an AC or DC power supply, whereby current being a primary factor affecting plasma manipulation.

14. The ion generator of claim 1, further comprising an anti-chamber which is adapted to enable the anode to be retracted without the need to pressurize the vacuum chamber from an experimental vacuum setting, separated by a butterfly valve capable of maintaining a desired pressure differential.

15. The ion generator of claim 14, wherein the anti-chamber comprising a lower section composed of a screw-driven base that feeds a driver with an anode mount, and an upper section that can be opened to enable change-out of the anode that is under a constant flow of inert gas to prevent atmospheric water adsorption.

* * * * *